(12) United States Patent
Jang et al.

(10) Patent No.: US 8,309,170 B2
(45) Date of Patent: Nov. 13, 2012

(54) MULTILAYER NANOCRYSTAL STRUCTURE AND METHOD FOR PRODUCING THE SAME

(75) Inventors: Eun Joo Jang, Suwon-si (KR); Shin Ae Jun, Seongnam-si (KR); Jung Eun Lim, Yongin-si (KR); Hye Ran Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 380 days.

(21) Appl. No.: 11/849,587

(22) Filed: Sep. 4, 2007

(65) Prior Publication Data

US 2008/0252209 A1 Oct. 16, 2008

(30) Foreign Application Priority Data

Mar. 26, 2007 (KR) .................. 10-2007-0029183

(51) Int. Cl.
*B05D 7/00* (2006.01)
(52) U.S. Cl. .................. 427/212; 427/214; 427/215
(58) Field of Classification Search .................. 427/212, 427/214, 215
See application file for complete search history.

(56) References Cited

U.S. PATENT DOCUMENTS

| | | | |
|---|---|---|---|
| 3,460,962 A * | 8/1969 | Thornton, Jr. ............ | 313/467 |
| 6,207,229 B1 | 3/2001 | Bawendi et al. | |
| 6,322,901 B1 | 11/2001 | Bawendi et al. | |
| 6,710,366 B1 * | 3/2004 | Lee et al. ............ | 257/14 |
| 7,056,471 B1 * | 6/2006 | Han et al. ............ | 420/523 |
| 2005/0129947 A1 * | 6/2005 | Peng et al. ............ | 428/403 |
| 2006/0157720 A1 * | 7/2006 | Bawendi et al. ............ | 257/98 |

FOREIGN PATENT DOCUMENTS

| EP | 1 666 562 A2 | 6/2006 |
|---|---|---|
| EP | 1666562 A2 * | 6/2006 |
| EP | 1 762 642 A2 | 3/2007 |

OTHER PUBLICATIONS

Xie R et al: "Synthesis and characterization of highly luminescent CdSe-Core CdS/Zn0.5Cd0.5Cd0.5S/ZnS multishell nanocrystals" Journal of the American Chemical Society, American Chemical Society, New York, USA, vol. 128 (Apr. 29, 2005), pp. 7480-7488.
Shinae Jun et al: "Synthesis of multi-shell nanocrystals by a single step coating process" Nanotechnology, IOP, Bristol, GB, vol. 17, No. 15, (Aug. 14, 2006), pp. 3892-3896.

* cited by examiner

*Primary Examiner* — Elena T Lightfoot
(74) *Attorney, Agent, or Firm* — Cantor Colburn LLP

(57) ABSTRACT

Disclosed herein is a multilayer nanocrystal structure comprising a nanocrystal alloy core comprising two or more nanocrystals and including an alloy interlayer formed at an interface between the two or more nanocrystals, and one or more layers of nanocrystal shells formed sequentially on the surface of the nanocrystal alloy core, wherein the nanocrystal shells each have different band gaps. The multilayer nanocrystal structure can be applied to various electronic devices owing to its advantages of high luminescence efficiency, superior optical stability, and superior chemical stability.

16 Claims, 4 Drawing Sheets

MULTILAYER NANOCRYSTAL STRUCTURE AND METHOD FOR PRODUCING THE SAME

This non-provisional application claims priority to Korean Patent Application No. 10-2007-0029183, filed on Mar. 26, 2007, and all the benefits accruing therefrom under 35 U.S.C. §119(a), the content of which is herein incorporated by reference in its entirety.

BACKGROUND OF THE INVENTION

1. Field of the Invention

The present invention relates to a multilayer nanocrystal structure and a method for producing a multilayer nanocrystal structure. More specifically, the present invention relates to a multilayer nanocrystal structure with high luminescence efficiency, superior optical stability and superior chemical stability, the multilayer nanocrystal structure comprising: a nanocrystal alloy core including an alloy interlayer, two or more nanocrystals formed at the interface between the two or more nanocrystals, and one or more layers of nanocrystal shells formed sequentially on a surface of the nanocrystal alloy core; and a method for producing the multilayer nanocrystal structure.

2. Description of the Related Art

A nanocrystal is defined as a material having a crystal size at the nanometer-scale level and composed of several hundred to several thousand atoms. Since such a small-sized nanocrystal has a large surface area per unit volume, most of the constituent atoms of the nanocrystal are present on the surface of the nanocrystal. Based on this characteristic structure, the nanocrystal exhibits quantum confinement effects, and shows electrical, magnetic, optical, chemical and mechanical properties that are different from the properties of bulk materials comprised of the constituent atoms used in the nanocrystal. That is, control over the physical size of nanocrystals enables the control of the properties of the nanocrystals.

Vapor deposition processes, including metal organic chemical vapor deposition ("MOCVD") and molecular beam epitaxy ("MBE"), have been used to prepare nanocrystals. More recently, wet chemistry techniques wherein a precursor material is added to an organic solvent to grow a nanocrystal have advanced significantly. According to the wet chemistry technique, as a crystal begins to grow, a dispersant coordinates to the surface of the crystal to control the crystal growth. Accordingly, the wet chemistry technique has an advantage in that nanocrystals can be uniformly prepared in size and shape in a relatively simple manner at low cost, compared to conventional vapor deposition processes, e.g., MOCVD and MBE.

A core-shell structured semiconductor nanocrystal with increased luminescence efficiency, and a method for preparing the semiconductor nanocrystal, are disclosed in U.S. Pat. Nos. 6,322,901 and 6,207,229, respectively. The core-shell structured semiconductor nanocrystal was reported to show improved luminescence efficiency while the luminescence wavelength of the core is essentially maintained due to passivation effects from the shell structure which contribute to reduction in defects on the surface of the core, and quantum confinement effects. However, the method for preparing the semiconductor nanocrystal has disadvantages in that relatively small-sized nanocrystals are necessarily used as a core and the small-size nanocrystals disadvantageously aggregate due to their instability upon formation of the shell. A shell whose surface has an insufficient thickness is unstable and is not therefore sufficiently passivated, and thus has the disadvantages of both low optical stability and poor chemical resistance.

BRIEF SUMMARY OF THE INVENTION

In view of the deficiencies of the prior art, in an embodiment, a multilayer nanocrystal structure with superior optical stability and superior chemical stability as well as high luminescence efficiency is provided.

In another embodiment, a method for producing the multilayer nanocrystal structure is provided.

In another embodiment, an electronic device comprising the multilayer nanocrystal structure is provided.

In accordance with one embodiment, there is provided a multilayer nanocrystal structure comprising: a nanocrystal alloy core comprising two or more nanocrystals and including an alloy interlayer formed at an interface between the two or more nanocrystals; and one or more layers of nanocrystal shells formed sequentially on a surface of the nanocrystal alloy core such that a first layer of nanocrystal shell completely covers the exposed surface of the nanocrystal alloy core, and each additional layer of nanocrystal shell completely covers an exposed surface of the previously formed layer of nanocrystal shell, wherein the nanocrystal shells and the nanocrystal alloy core all have different band gaps.

The nanocrystal shell can include one or more layers of nanocrystal shells, and the outermost shell of the nanocrystal shell can have a band gap larger than any one of those of the nanocrystal alloy core or the inner shells. The nanocrystal alloy core can be made of two or more materials selected from the group consisting of Group II-VI, Group III-V, Group IV-VI, Group IV alloys, and mixtures thereof. The nanocrystal shells can include one or more layers of nanocrystal shells sequentially grown, the nanocrystal shells can be selected from Group II-VI, Group III-V, Group IV, and Group IV-VI compounds and mixtures thereof. In an embodiment, the nanocrystal alloy core and nanocrystal shell layers are semiconducting, and the multilayer nanocrystal structure comprising these is a multilayer semiconductor nanocrystal structure.

In another embodiment, a method for producing a multilayer nanocrystal structure comprises: (a) forming a nanocrystal alloy core comprising two or more nanocrystals including an alloy interlayer formed on an interface between the two or more nanocrystals; and (b) sequentially growing one or more layers of nanocrystal shells having different band gaps on a surface of the nanocrystal alloy core such that a first layer of nanocrystal shell completely covers the exposed surface of the nanocrystal alloy core, and each additional layer of nanocrystal shell completely covers an exposed surface of the previously grown layer of nanocrystal shell to sequentially form the two or more nanocrystal shells.

The step (a) can comprise the sub-steps: forming a first nanocrystal; growing a second nanocrystal different from the first nanocrystal on the surface of the first nanocrystal; and forming an alloy interlayer at the interface between the first nanocrystal and the second nanocrystal by diffusion of a contacting portion of each of the first and second nanocrystals into each other.

In another embodiment, an electronic device comprises the multilayer nanocrystal structure.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

Figure 1A:
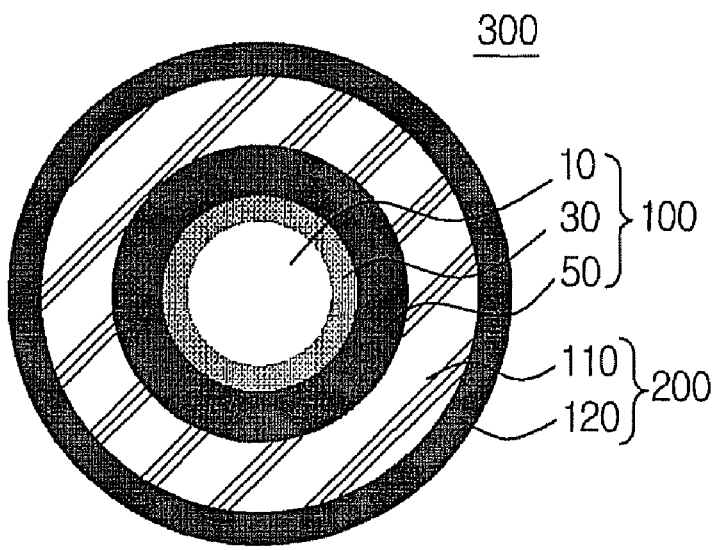
FIG. 1a is a view schematically showing an exemplary multilayer semiconductor nanocrystal structure according to an embodiment.

The present invention will now be described in more detail with reference to the accompanying drawings.

It will be understood that when an element is referred to as being "on" another element, it can be directly on the other element or intervening elements can be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements and the thicknesses of layers and regions are exaggerated for clarity.

The term "nanocrystal alloy core" as used herein refers to a nanocrystal comprising two or more nanocrystal materials. The nanocrystal alloy core has a structure in which an alloy interlayer is formed at the interface between the two or more materials. In an embodiment, the alloy interlayer has a compositional gradient comprising the two or more materials present at the interface.

To illustrate the alloy interlayer using an exemplary embodiment, a nanocrystal alloy core can be expressed notationally as "CdSe//ZnS". By use the expression, it is meant that the core has a structure in which an alloy interlayer is formed between a CdSe nanocrystal and a ZnS nanocrystal, and in which the exemplary alloy interlayer comprises a gradient ranging from 100% CdSe at the interface of the interlayer with the CdSe nanocrystal, to 100% ZnS at the interface of the interlayer with the ZnS nanocrystal. Similarly, an additional layer without formation of an interlayer is denoted by a single forward slash "/". In this way, the exemplary multilayer nanocrystal structure "CdSe//ZnS/CdSZnS" has, according to the above nomenclature, a nanocrystal alloy core having an inner CdSe core, an interlayer, an outer ZnS core, and a single mixed shell of CdS and ZnS.

A multilayer nanocrystal structure comprises a nanocrystal alloy core comprising two or more nanocrystals, including an alloy interlayer formed at an interface between the two or more nanocrystals; and one or more layers of nanocrystal shells formed on the surface of the nanocrystal alloy core such that a first layer of nanocrystal shell completely covers the exposed surface of the nanocrystal alloy core, and each additional layer of nanocrystal shell completely covers an exposed surface of the previously formed layer of nanocrystal shell, wherein the nanocrystal shell layers and nanocrystal alloy core all have different band gaps. In another embodiment, the multilayer nanocrystal structure comprises two or more layers of nanocrystal shell.

FIG. 1a shows the multilayer nanocrystal structure according to an embodiment. As shown in FIG. 1a, a nanocrystal 300 includes a nanocrystal alloy core 100 and one layer or a plurality of layers of nanocrystal shells 200 surrounding the nanocrystal alloy core 100. The structure of the nanocrystal alloy core 100 is shown in FIG. 1b.

Figure 1B:
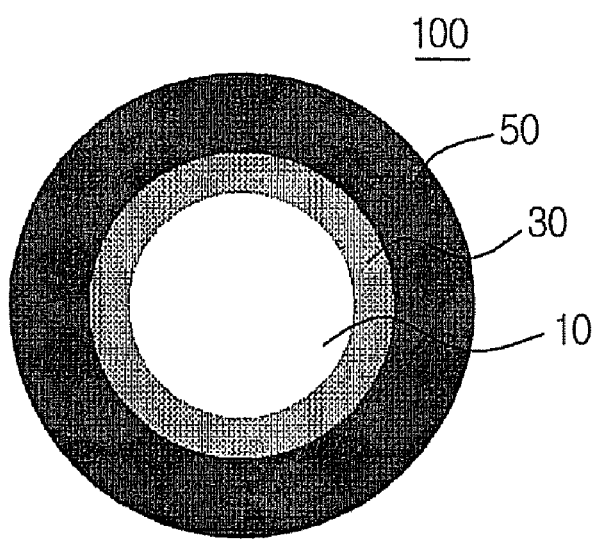
FIG. 1b is a view schematically showing an exemplary nanocrystal alloy core in the nanocrystal structure of FIG. 1a according to an embodiment.

As shown in FIG. 1b, the nanocrystal alloy core 100 includes a first nanocrystal 10, a second nanocrystal 50, and an alloy interlayer 30 interposed between the first nanocrystal 10 and the second nanocrystal 20. The alloy interlayer 30 reduces the difference in crystal lattice constant between the materials for the nanocrystals 10 and 20, and thus improves stability of the nanocrystal alloy core 100. As defined herein, "stability" refers to the resistance of the composite nanocrystal alloy to physical and chemical change that can degrade the luminescence and other desirable properties of the nanocrystal alloy.

For convenience, the multilayer nanocrystal structure is illustrated as possessing the shape of a sphere (as depicted in FIGS. 1a and 1b). However, the multilayer nanocrystal structure can have any shape, such as for example a rod, a tube, or a tripod, and can be symmetric or asymmetric, but is not limited to these shapes.

The multilayer nanocrystal structure can efficiently emit light in visible, ultraviolet and infrared regions. General core-shell structured semiconductor nanocrystals are known to exhibit high luminescence efficiency. But, as the size of a core is decreased for adjusting the emission wavelength to a desired level, the surface area of the nanocrystal is increased and thus surface defects are increased.

The multilayer nanocrystal structure includes a nanocrystal alloy core having an alloy interlayer between nanocrystal layers or segments of the core, thereby advantageously ensuring a relatively large-size of the nanocrystal structure and a reduction in surface defects. When the nanocrystal alloy core is composed of a Group II or V semiconductor compound, the multilayer nanocrystal structure emits light in a blue region of the visible spectrum. Accordingly, where the nanocrystal shells grow on the nanocrystal alloy core, the band gap of the nanocrystal shells can be controlled and thus the resulting emission wavelength can be varied. As a result, a nanocrystal that emits light in a visible radiation region, in particular at a blue light emission wavelength or longer is provided. In addition, the nanocrystal structure has advantages of superior optical stability and superior chemical stability as well as high luminescence efficiency due to the passivated nanocrystal shells.

In an embodiment of the multilayer nanocrystal structure 300, the shells 200 consist of two or more layers of nanocrystal shells 110 and 120. The outermost shell 120 can have a band gap larger than those of the nanocrystal alloy core and/or inner shells (where in an embodiment, "inner shell" is synonymous with "outer shell" where a single shell is used). When the inner shells layers have a small energy band gap compared to the alloy core, and are passivated, the energy band gap can be reduced due to increased size of the resulting nanocrystal, and thus an increase in the physical volume of the nanocrystal indicating the quantum confinement effect. The energy band gap of the inner nanocrystal shells overlaps with the energy band gap of the nanocrystal alloy core, leading to a decrease in the total energy band gap. In addition, the conduction band minimum and the valence band maximum in the energy band gap of the internal shells are reversed from each other, thereby causing a variation in the energy band gap due to variation in the physical structure associated with the quantum confinement effect. By use of these methods, the energy band gap of the final nanocrystal can be controlled. In addition, in an embodiment, the outermost shell is made of a material having a larger band gap than the inner shells, thereby maximizing the quantum confinement effect.

There is no particular limitation as to the material comprising the plurality of layers of shells 200. Specifically, two or more kinds of nanocrystal shells can be used, which are sequentially grown in layers. The nanocrystal shells can be selected from the group of semiconductor compounds consisting of Group II-VI compounds, Group II-VI compounds, Group III-V compounds, Group IV compounds, Group IV-VI compounds, and mixtures thereof. Exemplary of materials for the nanocrystal shells include CdS, CdSe, CdTe, ZnS, ZnSe, ZnTe, HgS, HgSe, HgTe, PbS, PbSe, PbTe, AlN, AlP, AlAs, GaN, GaP, GaAs, InN, InP, InAs, C, Si, Ge, Sn or a mixture thereof.

The material for the nanocrystal alloy core 100 can be selected from the group consisting of Group II-VI, Group III-V, Group IV-VI and Group IV semiconductor compounds, and mixtures thereof. Specific examples of the nanocrystal alloy core 100 include, but are not limited to, CdS, CdSe, CdTe, ZnS, ZnSe, ZnTe, HgS, HgSe, HgTe, PbS, PbSe, PbTe, AlN, AlP, AlAs, GaN, GaP, GaAs, InN, InP, InAs, C, Si, Ge, Sn and a mixture thereof.

The shape of the nanocrystal alloy core 100 can be selected from the group consisting of, but not limited to, spheres, tetrahedrons, cylinders, rods, triangles, discs, tripods, tetrapods, cubes, boxes, stars, tubes, or the like. In an embodiment, the shape of the nanocrystal alloy core is that of a sphere.

The surface of the multilayer nanocrystal structure can have an organic material selectively coordinated thereto. The coordination between the surface of the nanocrystal and the organic material contributes to improving suspension stability and preventing aggregation of adjacent nanocrystals. The organic material is prepared from a solvent used in nanocrystal growth to form the shell layers. There is no particular limitation on the organic material used, so long as it possesses the ability to coordinate to the nanocrystal material. More specifically, useful organic materials, can include, for example, $C_6$-$C_{24}$ alkanes and alkenes having a terminal carboxylic acid (—COOH) group; $C_6$-$C_{24}$ alkanes and alkenes having a terminal phosphonic acid (—PO(OH)$_2$) group; $C_6$-$C_{24}$ alkanes and alkenes having a terminal sulfhydryl (i.e., a thiol —SH), sulfinic acid (—SOOH), or sulfonic acid (—SO$_3$H) group; $C_6$-$C_{24}$ alkanes and alkenes having a terminal amino (—NH$_2$) group; and derivatives thereof. Specifically, as the organic material, there can be mentioned, for example, oleic acid, stearic acid, palmitic acid, hexylphosphonic acid, n-octylphosphonic acid, tetradecylphosphonic acid, octadecylphosphonic acid, n-octyl amine, or hexadecyl amine.

Figure 2:
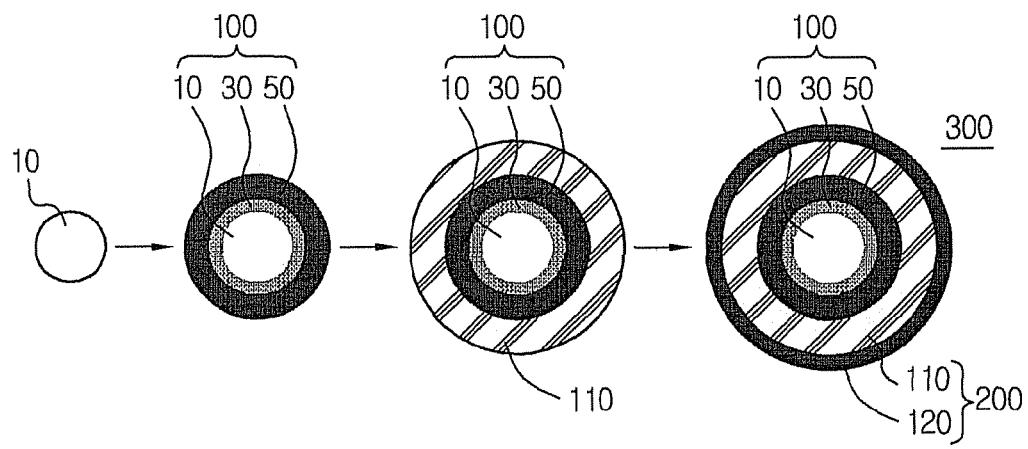
FIG. 2 is a diagram schematically showing a method for producing an exemplary nanocrystal structure according to an embodiment.
Figure 3:
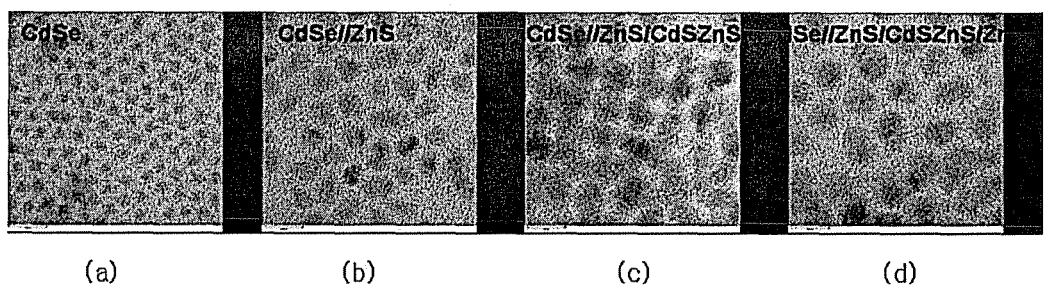
FIG. 3 is a TEM (transmission electron microscope) image of exemplary semiconductor nanocrystals each produced in Example 1.

In another embodiment, a method for producing a multilayer nanocrystal structure is disclosed. FIG. 2 schematically shows the steps of a method for producing a nanocrystal structure according to an embodiment. Hereinafter, the method is illustrated in more detail.

First, (a) a nanocrystal alloy core 100 is formed. The nanocrystal alloy core 100 includes an alloy interlayer formed at an interface between the two or more nanocrystals. It will be understood herein that where an interlayer is formed, the interlayer is in at least partial contact with all adjacent nanocrystals. Then, (b) one or more layers of nanocrystal shells 200, each having a different band gap, are grown on an exposed surface of the nanocrystal alloy core 100 or, for a second layer of nanocrystal shell 120, on an exposed surface of a first nanocrystal shell 110 which surrounds the nanocrystal alloy core 100, to produce a multilayer nanocrystal structure 300. The band gap of the final multilayer nanocrystal structure 300 can be controlled depending upon the thickness of and number of layers of nanocrystal shell, and the materials of the nanocrystal shells. In an embodiment, the first nanocrystal shell layer completely covers an exposed surface of the nanocrystal alloy core, and each additional shell layer completely covers an exposed surface of a previous shell layer. In an embodiment, the first nanocrystal shell layer is the only shell layer.

Referring to FIG. 2, the first nanocrystal 10 and the second nanocrystal 50 are diffused into each other in the nanocrystal alloy core 100 to form interlayer 30. As a result, the actual size of the emission core decreases, and the emission wavelength shifts toward a blue wavelength (i.e., is "blue shifted" toward a shorter wavelength). When an alloy is prepared from materials having a larger band gap, the emission wavelength is further shifted to a blue wavelength. When the nanocrystal alloy core 100 is coated with materials having a small bad gap to form a first nanocrystal shell layer 110, the band gap will vary, and thus the emission wavelength shifts toward a red wavelength (i.e., is "red shifted" toward a longer wavelength). Finally, a material having the largest band gap is applied to passivate a surface of the first nanocrystal shell layer 110 to form a second nanocrystal shell layer 120. As a result, the quantum confinement effect can be maximized. In an embodiment (not shown), the material having the largest band gap is the first nanocrystal layer 110, and no second shell layer is included.

In the step (a) of forming nanocrystal alloy core 100, a first nanocrystal 10 is produced, and a second nanocrystal 50 different from the first nanocrystal 10 is grown on the surface of the first nanocrystal 10. Then, the first nanocrystal 10 and the second nanocrystal 50 are diffused into each other to form an alloy interlayer 30 at the interface therebetween.

More specifically, in the step (a) of forming nanocrystal alloy core 100, a Group V, or VI precursor is added to a mixed system of a dispersant and a solvent containing a Group II, III, or VI precursor. The precursors are reacted to provide a first nanocrystal 10 of Group II-VI, Group III-V, Group IV-VI, or Group IV. A Group V, or VI precursor is added to the mixed system containing the produced first nanocrystal 10. The precursors are reacted to prepare a second nanocrystal 50. The first nanocrystal 10 and the second nanocrystal 50 are diffused into each other to form an alloy interlayer 30 at the interface between the first nanocrystal 10 and second nanocrystal 50. The alloy interlayer 30 is formed at an interface between the first nanocrystal 10 and the second nanocrystal 50, by diffusing the material of the first nanocrystal 10 into the second nanocrystal 50, and/or diffusing the material of the second nanocrystal 50 into the first nanocrystal 10. At this time, by formation of the alloy interlayer 30 at the interface to have a thickness corresponding to the decrease of the diffused nanocrystal, a novel nanocrystal structure can be provided. The alloy interlayer 30 reduces the difference in crystal lattice constant between the materials of the adjacent first nanocrystal 10 and second nanocrystal 50 and thus improves stability of the nanocrystal alloy core 100.

Meanwhile, in the step (b) of forming one or more layers of nanocrystal shells 200, a layer of a first nanocrystal is grown on a surface of the nanocrystal alloy core 100 to form a first nanocrystal shell layer 110. In an embodiment, the first nanocrystal shell layer 110 completely covers the outer surface of the nanocrystal alloy core 100. In a further embodiment, a second nanocrystal different from the first nanocrystal can be subsequently grown on the surface of the first nanocrystal shell layer 110 which surrounds the nanocrystal alloy core 100 to form a second nanocrystal shell layer 120. As a result, the nanocrystal shells 200 are formed on a surface of the nanocrystal alloy core 100, thereby producing a multilayer nanocrystal structure 300.

The first and second nanocrystals are grown by adding a Group V, or VI precursor to a mixed system of a dispersant and a solvent containing a Group II, III, or VI precursor, followed by reacting the precursors.

The growth of the first and second nanocrystals can be performed one or more times in succession. That is to say, when the multilayer nanocrystal structure 300, in which the nanocrystal shells are formed on the nanocrystal alloy core, is subjected to another growth of the first and second nanocrystals, the nanocrystals can be further grown or another layer can be additionally formed.

Specific examples of the metal precursors used in steps (a) and (b) include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, indium sulfate, or a combination comprising at least one of the foregoing metal precursors.

Exemplary Group V and VI precursors that can be used in step (a) of the method include: alkyl thiol compounds, such as hexane thiol, octane thiol, decane thiol, dodecane thiol, hexadecane thiol, mercaptopropyl silane, and the like; alkyl phosphines, such as sulfur-trioctylphosphine ("S-TOP"), sulfur-tributylphosphine ("S-TBP"), sulfur-triphenylphosphine ("S-TPP"), sulfur-trioctylamine ("S-TOA"), trimethylsilyl sulfur, ammonium sulfide, sodium sulfide, selenium-trioctylphosphine ("Se-TOP"), selenium-tributylphosphine ("Se-TBP"), selenium-triphenylphosphine ("Se-TPP"), tellurium-trioctylphosphine ("Te-TOP"), tellurium-tributylphosphine ("Te-TBP"), tellurium-triphenylphosphine ("Te-TPP"), trimethylsilyl phosphine, triethylphosphine, tributylphosphine, trioctylphosphine, triphenylphosphine and tricyclohexylphosphine, arsenic oxide, arsenic chloride, arsenic sulfate, arsenic bromide, arsenic iodide, nitrous oxide, nitric acid, ammonium nitrate, or a combination comprising at least one of the foregoing precursors.

In an embodiment, the concentrations and feeding rates of the precursors are controlled depending on the reactivity of the precursors, to reduce or eliminate the occurrence of side effects, such as for example, precipitation of metal particles and formation of particles due to reactions between the metals and the Group VI or V element precursors.

Exemplary solvents that can be used in steps (a) and (b) of the method include $C_{6-24}$ primary alkyl amines, $C_{6-24}$ secondary alkyl amines, $C_{6-24}$ tertiary alkyl amines, $C_{6-24}$ primary alcohols, $C_{6-24}$ secondary alcohols, $C_{6-24}$ tertiary alcohols, $C_{6-24}$ ketones, $C_{6-24}$ esters, $C_{6-24}$ heterocyclic compounds containing nitrogen or sulfur, $C_{6-24}$ alkanes, $C_{6-24}$ alkenes, $C_{6-24}$ alkynes, trioctylphosphine, trioctylphosphine oxide, or a combination comprising at least one of the foregoing solvents.

Exemplary dispersants that can be used in steps (a) and (b) of the method include $C_{6-24}$ alkanes and alkenes having a terminal —COOH group, $C_{6-24}$ alkanes and alkenes having a terminal —PO(OH)$_2$ group, $C_{6-24}$ alkanes and alkenes having a terminal —SH group, $C_{6-24}$ alkanes and alkenes having a terminal —NH$_2$ group, or a combination comprising at least one of the foregoing dispersants.

Specific examples of the dispersants include oleic acid, stearic acid, palmitic acid, hexyl phosphonic acid, n-octyl phosphonic acid, tetradecyl phosphonic acid, octadecyl phosphonic acid, n-octyl amine, or hexadecyl amine.

To facilitate the crystal growth and ensure the stability of the solvents, steps (a) and (b) of the method are carried out at about 100° C. to about 350° C. for about 5 seconds to about 4 hours.

In yet another embodiment, an electronic device, more particularly, an electroluminescent device, comprises the multilayer nanocrystal structure. The multilayer nanocrystal structure can be utilized in a variety of applications including: display devices, such as for example, plasma display panels ("PDPs") and luminescent diodes ("LEDs"), which necessarily include luminescent materials; electroluminescent devices which use nanocrystals as a light-emitting layer; sensors, such as for example, biosensors, which are reacted with target materials to emit light; and photovoltaic devices.

An electroluminescent device broadly can include all devices capable of converting electric energy into light energy. Since the multilayer nanocrystal structure disclosed herein has advantages in the controllability of the band gap, high quantum efficiency, and superior color purity, the multilayer nanocrystal structures can be applied to luminescent materials for various electroluminescent devices. As electroluminescent devices, there can be mentioned, for example, organic/inorganic hybrid electroluminescent devices that emit light in nanocrystals in which holes injected through a hole transport layer from a hole injecting electrode recombine with electrons injected through an electron transport layer from an electron injecting electrode. In addition, when semiconductor nanocrystals are used as phosphors for luminescent diodes ("LEDs"), they act as color converting materials capable of absorbing source light emitted from a diode, to which a current is applied, and converting the source light into light of a specific wavelength. Since semiconductor nanocrystals have optical gain properties, a composite having a predetermined concentration or above is prepared from the semiconductor nanocrystals, and the composite is put in a mirror structure, and the like, thereby realizing laser properties.

The multilayer nanocrystal structure of the present invention exhibits superior stability and high luminescence efficiency, and thus realizes superior properties, as compared to general multilayer nanocrystal structures, upon application to electroluminescent devices.

For example, the multilayer nanocrystal structure can be used for organic/inorganic hybrid electroluminescent devices. Such an organic/inorganic hybrid electroluminescent device can include, in an embodiment, a substrate, a hole injecting electrode disposed on a surface of the substrate, a hole transport layer disposed on a surface of the hole injection layer opposite the substrate, a light-emitting layer disposed on a surface of the hole transport layer opposite the hole injection layer, an electron transport layer disposed on a surface of the light-emitting layer opposite the hole transport layer, and an electron injecting electrode disposed on a surface of the electron transport layer opposite the light-emitting layer, and layered in this order. The light-emitting layer can include the multilayer nanocrystal structure disclosed herein. If necessary, a hole blocking layer can be interposed between the light-emitting layer and the electron transport layer.

The substrate used in the electroluminescent device of the present invention can be a substrate commonly used in the art. A glass or transparent plastic substrate is specifically useful because of its high transparency, superior surface smoothness, ease of handling, and excellent waterproofness. Specific examples of the transparent substrate include glass, polyethylene terephthalate, and polycarbonate substrates.

The materials for the hole injecting electrode can be an electrically conductive metal or its oxide. As specific examples of the materials, there can be mentioned indium tin oxide ("ITO"), indium zinc oxide ("IZO"), nickel (Ni), platinum (Pt), gold (Au), silver (Ag), and iridium (Ir).

The materials for the hole transport layer can be selected from those commonly used in the art. Examples of materials for the hole transport layer can include, but are not limited to, poly(3,4-ethylenedioxythiophene) ("PEDOT")/polystyrene para-sulfonate ("PSS") derivatives, poly-N-vinylcarbazole derivatives, polyphenylenevinylene derivatives, polyparaphenylene derivatives, polymethacrylate derivatives, poly (9,9-octylfluorene) derivatives, poly(spiro-fluorene) derivatives, and N,N'-diphenyl-N,N'-bis(3-methylphenyl)-(1,1'-biphenyl)-4,4'-diamine ("TPD"). The thickness of the hole transport layer is specifically 10 nm to 100 nm.

The materials for the electron transport layer can be selected from those materials commonly used in the art. Examples of materials for the electron transport layer include, but are not limited to, oxazoles, isooxazoles, triazoles, isothiazoles, oxydiazoles, thiadiazoles, perylenes, and aluminum complexes, including tris(8-hydroxyquinoline)-aluminum ("Alq$_3$"), bis(2-methyl-8-quinolinato)(p-phenyl-phenolato) aluminum ("BAlq") and bis(2-methyl-8-quinolinato) (triphenylsiloxy) aluminum (III) ("SAlq"). The thickness of the electron transport layer is specifically 10 nm to 100 nm.

Materials for the electron injecting electrode, include a low work function metal. Examples of the low work function metal include, but are not limited to, In, Ca, Ba, Ca/Al, LiF/Ca, LiF/Al, BaF$_2$/Al, BaF$_2$/Ca/Al, Al, Mg, and Ag:Mg alloys. The thickness of the electron injecting electrode is specifically 50 nm to 300 nm.

Examples of materials for the hole blocking layer also include those commonly used in the art. Specific examples of the materials include, but are not limited to: triazoles, such as 3-phenyl-4-(1'-naphthyl)-5-phenyl-1,2,4-triazole ("TAZ"); phenanthrolines, such as 2,9-dimethyl-1,10-phenanthroline ("BCP"); imidazoles; oxadiazoles; and aluminum complexes. The thickness of the hole blocking layer is specifically 5 nm to 50 nm.

Hereinafter, the present invention will be explained in more detail with reference to the following examples, which are provided for the purpose of illustration and are not to be construed as limiting the scope of the invention.

EXAMPLES

Example 1

Production of CdSe//ZnS/CdSZnS Nanocrystals 16 g of trioctylamine (hereinafter, referred to as "TOA"), 0.3 g of octadecyl phosphonic acid and 0.4 mmol of cadmium oxide were simultaneously placed in a 125 ml flask equipped with a reflux condenser. The reaction temperature of the mixture was adjusted to 300° C. with stirring.

Separately, selenium (Se) powder was dissolved in trioctylphosphine ("TOP") to obtain a Se-TOP complex solution (Se concentration: about 2 M), and 2 ml of the Se-TOP complex solution was rapidly fed to the previous reaction mixture. The reaction was continued for about 2 minutes.

After completion of the reaction, the reaction mixture was cooled to room temperature as rapidly as possible. Ethanol (10 ml) as a non-solvent was added to the reaction mixture, and then the resulting mixture was centrifuged. The obtained precipitate was separated from the supernatant, and dispersed in toluene (4 ml) to prepare a solution of a CdSe nanocrystal having a concentration of 10 mg/mL that emits light at a wavelength of 485 nm.

16 g of TOA, 0.1 g of oleic acid and 0.2 mmol of zinc acetate were simultaneously placed in a 125 ml flask equipped with a reflux condenser. The reaction temperature of the mixture was adjusted to about 300° C. with stirring. After the CdSe nanocrystal solution so prepared was added to the reaction mixture, 1 ml of an S-TOP complex solution (0.8 M sulfur powder in TOP) was slowly added thereto. The reaction was continued for about one hour to grow a ZnS nanocrystal on the CdSe nanocrystal to produce a CdSe//ZnS alloy nanocrystal at the interface between the ZnS nanocrystal and the CdSe nanocrystal, via thermally induced diffusion of a portion of the CdSe and ZnS nanocrystals at the interface into each other for a limited distance.

After completion of the reaction, the reaction mixture was cooled to room temperature as rapidly as possible. Ethanol (10 ml) as a non-solvent was added to the reaction mixture, and then the resulting mixture was centrifuged. The obtained precipitate was separated from the supernatant, and dispersed in toluene (2 ml) to prepare a solution of a CdSe//ZnS alloy nanocrystal having an average particle size of about 5 nm that emits light at a wavelength of 458 nm.

16 g of TOA, 0.47 g of oleic acid, 0.05 mmol of cadmium oxide and 0.4 mmol of zinc acetate were simultaneously placed in a 125 ml flask equipped with a reflux condenser. The reaction temperature of the mixture was adjusted to 300° C. with stirring. After the CdSe//ZnS nanocrystal solution prepared above was added to the reaction mixture, 1 ml of an S-TOP complex solution (0.8 M solution of sulfur in TOP) was slowly added thereto. The reaction was continued for about one hour to grow a CdSZnS nanocrystal on the CdSe//ZnS nanocrystal to produce a CdSe//ZnS/CdSZnS nanocrystal that emits light at a wavelength of 535 nm.

After the reaction was completed, the reaction mixture was cooled to room temperature as rapidly as possible. Ethanol (10 ml) as a non-solvent was added to the reaction mixture, and the resulting mixture was centrifuged. The obtained precipitate was separated from the supernatant, and dispersed in toluene (2ml) to prepare a solution having a concentration of 5 mg/mL of the CdSe//ZnS/CdSZnS nanocrystals. The quantum efficiency of the CdSe//ZnS/CdSZnS nanocrystals was determined to be 93%.

8 g of TOA, 0.06 g of oleic acid, and 0.1 mmol of zinc acetate were simultaneously placed in a 125 ml flask equipped with a reflux condenser. The reaction temperature of the mixture was adjusted to 300° C. with stirring. After the CdSe//ZnS/CdSZnS nanocrystal solution prepared as above was added to the reaction mixture, 0.5 ml of an S-TOP complex solution (0.8 M solution of sulfur in TOP) was slowly added thereto. The reaction was continued for about one hour to grow a ZnS nanocrystal layer on the CdSe//ZnS/CdSZnS nanocrystal to produce a CdSe//ZnS/CdSZnS/ZnS nanocrystal that emits light at a wavelength of 530 nm.

After the reaction was completed, the reaction mixture was cooled to room temperature as rapidly as possible. Ethanol (10 ml) as a non-solvent was added to the reaction mixture, and the resulting mixture was centrifuged. The obtained precipitate was separated from the supernatant, and dispersed in toluene (2 ml) to prepare a solution having a concentration of 5 mg/mL of the CdSe//ZnS/CdSZnS/ZnS nanocrystals. The quantum efficiency of the CdSe//ZnS/CdSZnS nanocrystals was determined to be 90%.

The CdSe, CdSe//ZnS, CdSe//ZnS/CdSZnS crystals and CdSe//ZnS/CdSZnS/ZnS thus produced were identified by transmission electron microscopy ("TEM"). The resulting nanocrystals are shown in FIG. 3a-d.

Example 2

Production of CdSe//ZnS/CdSZnS Nanocrystals with Controlled Band Gap 8 g of TOA, 0.1 g of oleic acid, 0.1 mmol of cadmium oxide and 0.4 mmol of zinc acetate were simultaneously placed in a 125 ml flask equipped with a reflux condenser. The reaction temperature of the mixture was adjusted to 300° C. with stirring. After 2 ml of the CdSe//ZnS nanocrystal solution prepared in Example 1 was added to the reaction mixture, 1 ml of an S-TOP complex solution (0.8 M of sulfur in TOP) was slowly added thereto. The reaction was continued for about one hour to grow a CdSZnS nanocrystal on the CdSe//ZnS nanocrystal to produce a CdSe//ZnS/CdSZnS nanocrystal that emits light at a wavelength of 554 nm.

After the reaction was completed, the reaction mixture was cooled to room temperature as rapidly as possible. Ethanol (10 ml) as a non-solvent was added to the reaction mixture, and the resulting mixture was centrifuged. The obtained precipitate was separated from the supernatant, and dispersed in toluene (2 ml) to produce a solution of the CdSe//ZnS/CdSZnS nanocrystal (in a molar ratio based on metal cation of, respectively, 1:4:8). The quantum efficiency of the CdSe//ZnS/CdSZnS nanocrystals was determined to be 67%.

Example 3

Production of CdSe//ZnS/CdSZnS Nanocrystals According to Changes in Band Gap 8 g of TOA, 0.1 g of oleic acid, 0.2 mmol of cadmium oxide and 0.4 mmol of zinc acetate were simultaneously placed in a 125 ml flask equipped with a reflux condenser. The reaction temperature of the mixture was adjusted to 300° C. with stirring. After the CdSe//ZnS nanocrystal solution prepared in Example 1 was added to the reaction mixture, 1 ml of an S-TOP complex solution (0.8 M of sulfur in TOP) was slowly added thereto. The reaction was continued for about one hour to grow a CdSZnS nanocrystal on the CdSe//ZnS nanocrystal to produce a CdSe//ZnS/CdSZnS nanocrystal that emits light at a wavelength of 570 nm.

After the reaction was completed, the reaction mixture was cooled to room temperature as rapidly as possible. Ethanol (10 ml) as a non-solvent was added to the reaction mixture, and the resulting mixture was centrifuged. The obtained precipitate was separated from the supernatant, and dispersed in toluene (2 ml) to produce a solution of the CdSe//ZnS/CdSZnS nanocrystal (in a molar ratio based on metal cation of, respectively, 2:4:8 (a molar ratio of the Cd, Zn, and S precursors). The quantum efficiency of the CdSe//ZnS/CdSZnS nanocrystal was determined to be 41%.

Figure 4:
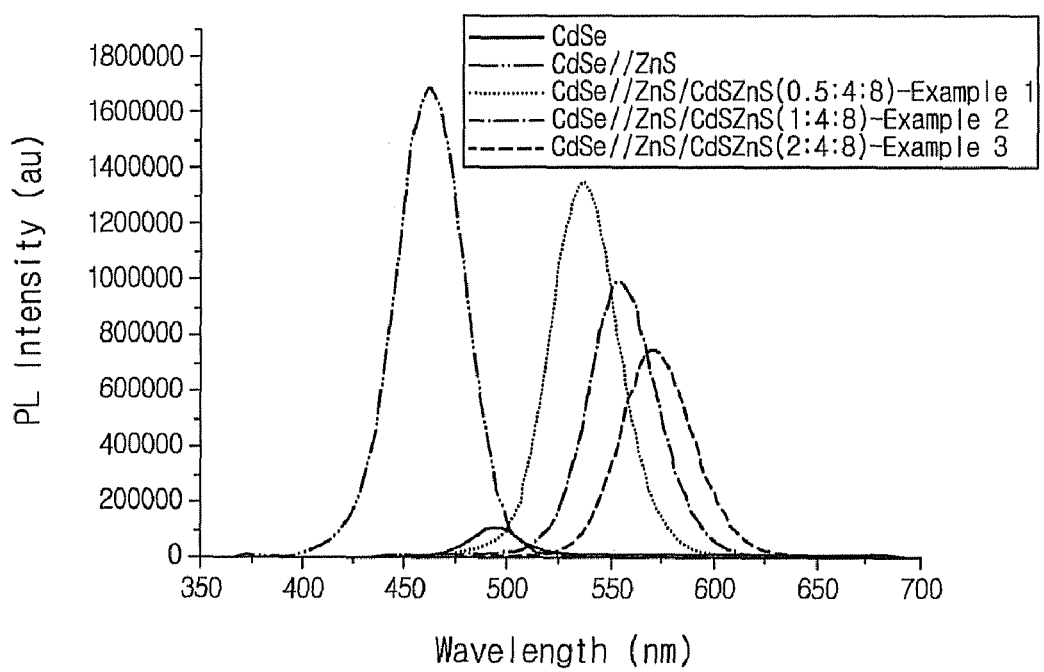
FIG. 4 is a luminescence spectrum of exemplary semiconductor nanocrystals each produced in Examples 1 to 3.

The luminescence spectrum of the semiconductor nanocrystal each produced in Examples 1, 2 and 3 was illustrated in FIG. 4. The spectrum demonstrates that the emission wavelength of the nanocrystal was shifted to a red wavelength, as the thickness of the shell increases.

Example 4

Fabrication of Luminescent Diode using CdSe//ZnS/CdSZnS Nanocrystal

A solution containing hexane and ethanol (6:4, v/v) was added to the CdSe//ZnS/CdSZnS semiconductor nanocrystal (emission wavelength: 535 nm) produced in Example 1. The mixture was centrifuged at 6,000 rpm for 10 minutes to obtain a precipitate from the resulting mixture.

To the precipitate was added chloroform as a solvent to prepare a semiconductor nanocrystal solution of 1 wt %. SJ4500 A and B resins (each available from SJ chemical) were mixed in a volume ratio of 1:1 as an epoxy resin. Then, the epoxy resin mixture was defoamed. The epoxy resin (0.1 ml) was mixed with the semiconductor nanocrystal solution of 1 wt % (0.1 ml) with homogeneously stirring. The reaction mixture was stood under vacuum for about one hour to remove the chloroform. About 20 micrometers of the residue (the green semiconductor nanocrystal and epoxy resin) was applied to a lamp-type blue luminescent diode in the form of a cup, followed by primary curing at 100° C. for 3 hours.

After the primary curing, the blue luminescent diode comprising a light emitting layer and the epoxy resin were put in a mold and subjected to secondary curing at 100° C. for 3 hours to produce a lamp-type blue luminescent diode.

Figure 5:
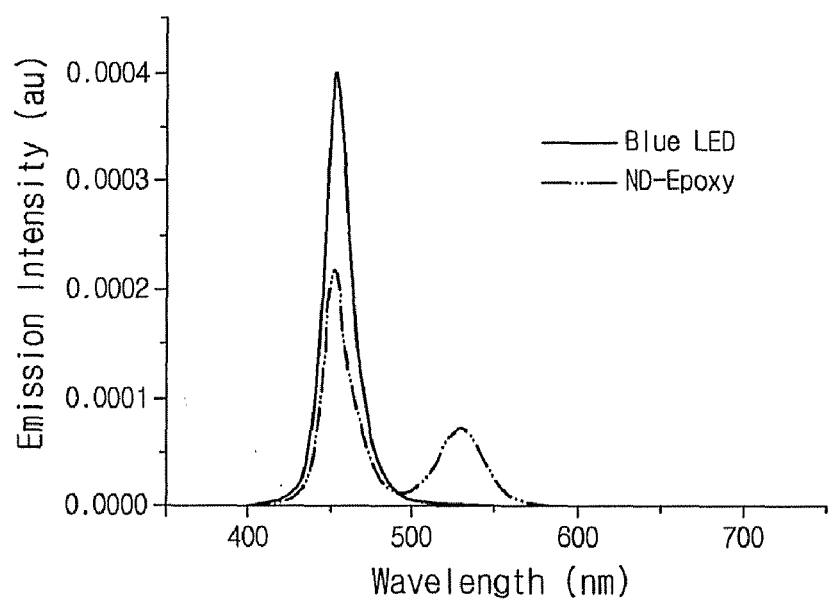
FIG. 5 is a luminescence spectrum of an exemplary LED (light emission diode) fabricated in Example 4.

The luminescent diode thus produced was placed in an integrating sphere to measure the luminescence properties of the diode. The light conversion efficiency and luminescence spectrum of the diode were analyzed by evaluating the luminescence properties with an ISP75 spectrometer system from Instrument Systems. FIG. 5 shows a luminescence spectrum of the luminescent diode. It can be confirmed from the luminescence spectrum that the maximum luminescence wavelength of the luminescent diode is 535 nm, and the average light conversion efficiency was determined to be about 30%. In FIG. 5, "blue LED" corresponds to the luminescence spectrum of the LED containing no nanocrystal, and "ND-Epoxy" corresponds to the luminescence spectrum of the LED where nanocrystals are applied to the blue LED.

Experimental Example 1

Evaluation of Luminescence Stability of Semiconductor Nanocrystals

About 100 microliters of each of the CdSe, CdSe//ZnS and CdSe//ZnS/CdSZnS nanocrystal solutions prepared in Example 1 were placed on washed glass substrates, followed by slowly drying at room temperature, to prepare two samples of each nanocrystal solution. Of the two samples of each nanocrystal, one sample was exposed to room light for about 96 hours, while another sample was exposed to a UV lamp having a light intensity of 3 mW/cm$^2$ at a wavelength of 365 nm for about 96 hours. The luminescence properties of each of these samples as excited by UV light emitted from the UV lamp were evaluated. The results are shown in the photograph in FIG. 6.

Figure 6:
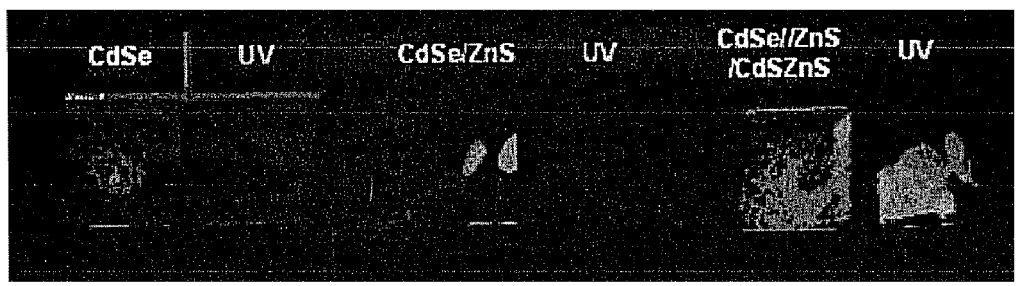
FIG. 6 is a photograph showing changes in luminescence stability over time for an exemplary semiconductor nanocrystal produced in Example 1.

It can be seen from the photograph in FIG. 6 that both the CdSe and CdSe//ZnS nanocrystals exposed to UW light for 96 hours lost their luminescence properties, but that the multilayer nanocrystal structures (CdSe//ZnS/CdSZnS) maintained their luminescence properties after the UV exposure.

Experimental Example 2

Evaluation of Luminescence Stability of Semiconductor Nanocrystal-Epoxy Composite To each of the CdSe, CdSe//ZnS and CdSe//ZnS/CdSZnS nanocrystal solutions prepared in Example 1 was added a solution of hexane and ethanol (6:4, v/v). The resulting mixtures were centrifuged at 6,000 rpm for 10 minutes to obtain the corresponding nanocrystals as a precipitate.

To each precipitate was added chloroform as a solvent to prepare a semiconductor nanocrystal solution having a concentration of 1 wt %. SJ4500 A and B resins (each available from SJ chemical) were mixed in a volume ratio of 1:1 as an epoxy resin. Then, the epoxy resin mixture was defoamed. The epoxy resin (0.1 ml) was mixed with the semiconductor nanocrystal solution of 1 wt % (0.1 ml) with homogeneous stirring. The reaction mixture was kept under vacuum for about one hour to remove the chloroform from the mixture.

About 0.1 ml of each of the resulting residues (i.e., the uncured composite of the semiconductor nanocrystal and the epoxy resin) was placed on washed glass substrates, and cured at 80° C. for 2 hours, to prepare two samples of each corresponding cured composite.

Of the two samples of each nanocrystal, one sample was exposed to room light for about 96 hours, while the other sample was exposed to a UV lamp having a light intensity of 3 mW/cm$^2$ at a wavelength of 365 nm for about 96 hours. The luminescence properties of each of these samples as excited by UV light emitted from the UV lamp were evaluated. The results are shown as a photograph in FIG. 7.

Figure 7:
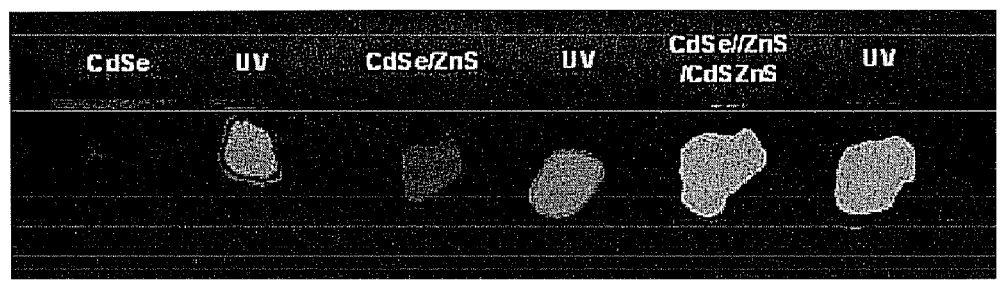
FIG. 7 is a photograph showing a comparison of chemical stability and luminescence stability between exemplary semiconductor nanocrystal-epoxy composites produced in Example 1.

It can be confirmed in the photograph in FIG. 7 that CdSe and CdSe//ZnS nanocrystals exposed to UV light for 96 hours showed considerable deterioration in luminescence properties, but the multishell nanocrystal structures (CdSe//ZnS/CdSZnS) maintained their luminescence properties.

As seen in the foregoing, the multilayer nanocrystal structure disclosed herein comprises a nanocrystal alloy core comprising two or more nanocrystals and includes an alloy interlayer formed at the interface between the two or more nanocrystals, and two or more sequential layers of nanocrystal shells disposed on a surface of and surrounding the nanocrystal alloy core. As a result, the multilayer nanocrystal structure has advantages of high luminescence efficiency, superior optical stability and superior chemical stability. In addition, the energy band gap of the multilayer nanocrystal structure can be adjusted to a desired level by controlling the energy band gaps of the nanocrystal alloy core and nanocrystal shells. In conclusion, when the multilayer nanocrystal structure disclosed herein is applied to electroluminescent devices, it can exhibit superior stability and high luminescence efficiency, and thus provide superior properties when compared to general multilayer nanocrystal structures.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for producing a multilayer nanocrystal structure comprising:
   (a) forming a nanocrystal alloy core comprising two or more nanocrystal layers and including an alloy interlayer formed at an interface between the two or more nanocrystal layers, by
   forming a first nanocrystal;
   adding the first nanocrystal to a first precursor of a second nanocrystal, wherein the second nanocrystal is different from the first nanocrystal;
   adding a second precursor of the second nanocrystal; and
   growing the second nanocrystal on a surface of the first nanocrystal simultaneously with forming an alloy interlayer at the interface between the first nanocrystal and the second nanocrystal by diffusion of the first nanocrystal and second nanocrystal into each other; and
   (b) sequentially growing one or more layers of nanocrystal shells, each having different band gaps, on a surface of the nanocrystal alloy core to form the nanocrystal shells such that a first layer of nanocrystal shell completely covers the exposed surface of the nanocrystal alloy core, and each additional layer of nanocrystal shell completely covers an exposed surface of a previous layer of nanocrystal shell; wherein
   an outermost shell of the nanocrystal shells has a band gap larger than any one band gap of the nanocrystal alloy core, and the inner shell layers have a smaller band gap compared to that of the nanocrystal alloy core.

2. The method according to claim 1, wherein step (a) further comprises:
   forming the first nanocrystal by reacting a Group V, or VI precursor with a mixed system of a dispersant and a solvent containing a Group II, III, or IV precursor; and
   growing the second nanocrystal on the surface of the first nanocrystal by reacting a Group V, or VI precursor with the mixed system containing the first nanocrystal.

3. The method according to claim 1, wherein step (b) comprises:
   (b1) forming the first nanocrystal shell layer by growing a first nanocrystal on an exposed surface of the nanocrystal alloy core produced in step (a); and
   (b2) forming a second nanocrystal shell layer by growing a second nanocrystal different from the first nanocrystal on an exposed surface of the first nanocrystal shell layer.

4. The method according to claim 3, further comprising repeating steps (b1) and (b2) one or more times.

5. The method according to claim 3, wherein steps (b1) and (b2) include growing a nanocrystal by adding a Group V or VI precursor to a mixture of a solvent and a dispersant containing a Group II, III, or IV precursor, and reacting the precursors with each other.

6. The method according to claim 2, wherein the Group II, III or IV precursor is selected from the group consisting of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, and indium sulfate.

7. The method according to claim 5, wherein the Group II, III or IV precursor is selected from the group consisting of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, and indium sulfate.

8. The method according to claim 2, wherein the Group V or VI precursor is selected from the group consisting of alkyl thiol compounds, including hexane thiol, octane thiol, decane thiol, dodecane thiol, hexadecane thiol and mercaptopropyl silane; and alkyl phosphines, including sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-trioctylphosphine (Te-TOP), tellurium-tributylphosphine (Te-TBP), tellurium-triphenylphosphine (Te-TPP), trimethylsilyl phosphine, triethylphosphine, tributylphosphine, trioctylphosphine, triphenylphosphine and tricyclohexylphosphine, arsenic oxide, arsenic chloride, arsenic sulfate, arsenic bromide, arsenic iodide, nitrous oxide, nitric acid, and ammonium nitrate.

9. The method according to claim 2, wherein the solvent is selected from the group consisting of $C_{6-24}$ primary alkyl amines, $C_{6-24}$ secondary alkyl amines, $C_{6-24}$ tertiary alkyl amines, $C_{6-24}$ primary alcohols, $C_{6-24}$ secondary alcohols, $C_{6-24}$ tertiary alcohols, $C_{6-24}$ ketones, $C_{6-24}$ esters, $C_{6-24}$ heterocyclic compounds containing nitrogen or sulfur, $C_{6-24}$ alkanes, $C_{6-24}$ alkenes, $C_{6-24}$ alkynes, trioctylphosphine, trioctylphosphine oxide, and mixtures thereof.

10. The method according to claim 2, wherein the dispersant is selected from the group consisting of $C_{6-24}$ alkanes and alkenes having a terminal carboxylic acid (—COOH) functional group, $C_{6-24}$ alkanes and alkenes having a terminal phosphoric acid (—PO(OH)$_2$) functional group, $C_{6-24}$ alkanes and alkenes having a terminal sulfhydryl (—SH) functional group, $C_{6-24}$ alkanes and alkenes having a terminal sulfinic acid (—SOOH) functional group, $C_{6-24}$ alkanes and alkenes having a terminal sulfonic acid (—SO$_3$H) functional group, and $C_{6-24}$ alkanes and alkenes having a terminal amine (—NH$_2$) group.

11. The method according to claim 10, wherein the dispersant is selected from the group consisting of oleic acid, stearic acid, palmitic acid, hexyl phosphonic acid, n-octyl phosphonic acid, tetradecyl phosphonic acid, octadecyl phosphonic acid, n-octyl amine, hexadecyl amine, and a mixture thereof.

12. The method according to claim 5, wherein the solvent is selected from the group consisting of $C_{6-24}$ primary alkyl amines, $C_{6-24}$ secondary alkyl amines, $C_{6-24}$ tertiary alkyl amines, $C_{6-24}$ primary alcohols, $C_{6-24}$ secondary alcohols, $C_{6-24}$ tertiary alcohols, $C_{6-24}$ ketones, $C_{6-24}$ esters, $C_{6-24}$ heterocyclic compounds containing nitrogen or sulfur, $C_{6-24}$ alkanes, $C_{6-24}$ alkenes, $C_{6-24}$ alkynes, trioctylphosphine, trioctylphosphine oxide, and mixtures thereof.

13. The method according to claim 5, wherein the dispersant is selected from the group consisting of $C_{6-24}$ alkanes and alkenes having a terminal carboxylic acid (—COOH) functional group, $C_{6-24}$ alkanes and alkenes having a terminal phosphonic acid (—PO(OH)$_2$) functional group, and $C_{6-24}$ alkanes and alkenes having a terminal sulfhydryl (—SH) functional group, $C_{6-24}$ alkanes and alkenes having a terminal sulfinic acid (—SOOH) functional group, $C_{6-24}$ alkanes and alkenes having a terminal sulfonic acid (—SO$_3$H) functional group, and $C_{6-24}$ alkanes and alkenes having a terminal amine (—NH$_2$) group.

14. The method according to claim 13, wherein the dispersant is selected from the group consisting of oleic acid, stearic acid, palmitic acid, hexyl phosphonic acid, n-octyl phosphonic acid, tetradecyl phosphonic acid, octadecyl phosphonic acid, n-octyl amine, hexadecyl amine, and a mixture thereof.

15. The method according to claim 1, wherein steps (a) and (b) are carried out at a temperature of about 100° C. to about 350° C. for about 5 seconds to about 4 hours.

16. The method according to claim 1, wherein the forming the alloy interlayer and the growing the second nanocrystal are carried out substantially at a same temperature.

* * * * *